(12) United States Patent
Kuo et al.

(10) Patent No.: US 10,636,773 B2
(45) Date of Patent: Apr. 28, 2020

(54) SEMICONDUCTOR PACKAGE STRUCTURE AND METHOD FOR FORMING THE SAME

(71) Applicant: MediaTek Inc., Hsin-Chu (TW)

(72) Inventors: Che-Hung Kuo, Tainan (TW); Che-Ya Chou, Kaohsiung (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/203,444

(22) Filed: Jul. 6, 2016

(65) Prior Publication Data

US 2017/0084589 A1 Mar. 23, 2017

Related U.S. Application Data

(60) Provisional application No. 62/222,439, filed on Sep. 23, 2015.

(51) Int. Cl.
*H01L 25/10* (2006.01)
*H01L 23/538* (2006.01)
(Continued)

(52) U.S. Cl.
CPC ........ *H01L 25/105* (2013.01); *H01L 21/6835* (2013.01); *H01L 23/3128* (2013.01);
(Continued)

(58) Field of Classification Search
CPC ............... H01L 25/105; H01L 25/0657; H01L 23/5389; H01L 23/3128; H01L 23/5384; H01L 23/5838; H01L 23/49816; H01L 21/6835; H01L 21/568; H01L 24/19; H01L 24/20; H01L 2225/1035; H01L 2225/1041; H01L 2225/06568; H01L 2225/1058;
(Continued)

(56) References Cited

U.S. PATENT DOCUMENTS

| 6,093,969 | A  | * | 7/2000 | Lin   | H01L 23/24  |
|           |    |   |        |       | 257/777     |
| 6,229,217 | B1 | * | 5/2001 | Fukui | H01L 21/561 |
|           |    |   |        |       | 257/685     |

(Continued)

FOREIGN PATENT DOCUMENTS

| CN | 103296014 A    | 9/2013 |
|----|----------------|--------|
| CN | 103730434 A    | 4/2014 |
| WO | 2013127035 A1  | 9/2013 |

*Primary Examiner* — Dale E Page
*Assistant Examiner* — Quovaunda Jefferson
(74) *Attorney, Agent, or Firm* — Wolf, Greenfield & Sacks, P.C.

(57) ABSTRACT

A semiconductor package structure is provided. The semiconductor package structure includes a first semiconductor die including a first active surface and a first non-active surface. The semiconductor package structure also includes a second semiconductor die including a second active surface and a second non-active surface. The second semiconductor die is stacked on the first semiconductor die. The first non-active surface faces the second non-active surface. The semiconductor package structure further includes a first redistribution layer (RDL) structure. The first active surface faces the first RDL structure. In addition, the semiconductor package structure includes a second RDL structure. The second active surface faces the second RDL structure.

19 Claims, 9 Drawing Sheets

(51) Int. Cl.
*H01L 23/31* (2006.01)
*H01L 21/683* (2006.01)
*H01L 23/00* (2006.01)
*H01L 25/065* (2006.01)
*H01L 21/56* (2006.01)
*H01L 23/498* (2006.01)

(52) U.S. Cl.
CPC ...... *H01L 23/5383* (2013.01); *H01L 23/5384* (2013.01); *H01L 23/5389* (2013.01); *H01L 24/19* (2013.01); *H01L 24/20* (2013.01); *H01L 21/568* (2013.01); *H01L 23/49816* (2013.01); *H01L 25/0657* (2013.01); *H01L 2221/68345* (2013.01); *H01L 2221/68359* (2013.01); *H01L 2221/68372* (2013.01); *H01L 2224/04042* (2013.01); *H01L 2224/04105* (2013.01); *H01L 2224/12105* (2013.01); *H01L 2224/19* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/14* (2013.01); *H01L 2924/1421* (2013.01); *H01L 2924/1431* (2013.01); *H01L 2924/1432* (2013.01); *H01L 2924/1434* (2013.01); *H01L 2924/1436* (2013.01); *H01L 2924/14335* (2013.01); *H01L 2924/15311* (2013.01); *H01L 2924/3511* (2013.01)

(58) Field of Classification Search
CPC . H01L 2224/48091; H01L 2224/32225; H01L 2224/12105; H01L 2224/04105; H01L 2224/04042; H01L 2224/92244; H01L 2224/48227; H01L 2224/19; H01L 2924/1436; H01L 2924/1432; H01L 2924/15311; H01L 2924/1434; H01L 2924/14335; H01L 2221/68359; H01L 2221/68345

See application file for complete search history.

(56) References Cited

U.S. PATENT DOCUMENTS

| | | | | |
|---|---|---|---|---|
| 6,707,143 | B2* | 3/2004 | Fujimoto | H01L 25/0657 257/678 |
| 7,923,304 | B2* | 4/2011 | Choi | H01L 23/3121 438/127 |
| 2002/0045290 | A1* | 4/2002 | Ball | H01L 25/0657 438/106 |
| 2002/0135058 | A1* | 9/2002 | Asahi | H01L 23/5389 257/687 |
| 2003/0197284 | A1* | 10/2003 | Khiang | H01L 23/3114 257/777 |
| 2008/0079150 | A1* | 4/2008 | Simon | H01L 23/3114 257/737 |
| 2009/0127686 | A1* | 5/2009 | Yang | H01L 24/82 257/686 |
| 2009/0239336 | A1 | 9/2009 | Lee et al. | |
| 2010/0044845 | A1 | 2/2010 | Funaya et al. | |
| 2010/0193930 | A1* | 8/2010 | Lee | H01L 23/49816 257/686 |
| 2012/0056312 | A1 | 3/2012 | Pagaila et al. | |

\* cited by examiner

SEMICONDUCTOR PACKAGE STRUCTURE AND METHOD FOR FORMING THE SAME

CROSS REFERENCE TO RELATED APPLICATIONS

This Application claims the benefit of U.S. Provisional Application No. 62/222,439 filed on Sep. 23, 2015, the entirety of which is incorporated by reference herein.

BACKGROUND OF THE INVENTION

Field of the Invention

The present invention relates to a semiconductor package structure, and in particular to a multi-die semiconductor package structure and methods for forming the same.

Description of the Related Art

With the continued development of electronics industries, such as those related to the 3Cs (Computer, Communications and Consumer electronics), there has been rapidly increasing consumer demand for devices that are multi-functional, more convenient, and smaller. This demand has driven the need for increased integrated circuit (IC) density. Increased input-output (I/O) pin count and increased demands for IC density have led to the development of multi-die packages. With demands for high performance and high integration, a dual-dies fan-out wafer level chip scale package (WLCSP), through silicon via (TSV) technology and a three-dimensional package on package (3D PoP) structure, have been accepted as some alternative choices.

However, a dual-dies fan-out WLCSP includes two dies disposed side by side. Accordingly, the size of the package is too big and warpage is an issue of concern. TSV technology comprises forming TSVs penetrating multiple dies. Accordingly, the fabrication cost is high and it wastes the area of the dies. A 3D PoP structure stacks a top package on a bottom package. Accordingly, it is difficult to reduce the thickness of the 3D PoP structure even further.

Therefore, a novel semiconductor package structure and methods for forming the same are desirable.

BRIEF SUMMARY OF THE INVENTION

A semiconductor package structure and a method for forming a semiconductor package structure are provided.

An exemplary embodiment of a semiconductor package structure includes a first semiconductor die including a first active surface and a first non-active surface. The semiconductor package structure also includes a second semiconductor die including a second active surface and a second non-active surface. The second semiconductor die is stacked on the first semiconductor die. The first non-active surface faces the second non-active surface. The semiconductor package structure further includes a first redistribution layer structure. The first active surface faces the first redistribution layer structure. In addition, the semiconductor package structure includes a second redistribution layer structure. The second active surface faces the second redistribution layer structure.

Another exemplary embodiment of a semiconductor package structure includes a first semiconductor die including a first conductive pad. The semiconductor package structure also includes a second semiconductor die including a second conductive pad. The second semiconductor die vertically overlaps the first semiconductor die. The first and second conductive pads face away from each other. The semiconductor package structure further includes a molding compound surrounding the first semiconductor die and the second semiconductor die.

An exemplary embodiment of a method for forming a semiconductor package structure includes providing a first semiconductor die including a first non-active surface. The method also includes stacking a second semiconductor die on the first semiconductor die. The first non-active surface faces a second non-active surface of the second semiconductor die. The method further includes forming a molding compound surrounding the first and second semiconductor dies.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions may or may not correspond to actual dimensions in the practice of the invention.

FIGS. 1A-1E are cross-sectional views of various stages of a method for forming a semiconductor package structure, in accordance with some embodiments of the disclosure. Additional operations can be provided before, during, and/or after the stages described in FIGS. 1A-1E. Some of the stages that are described can be replaced or eliminated for different embodiments. Additional features can be added to the semiconductor package structure. Some of the features described below can be replaced or eliminated for different embodiments. To simplify the diagram, only a portion of the semiconductor package structure is depicted in FIGS. 1A-1E.

Figure 1A:
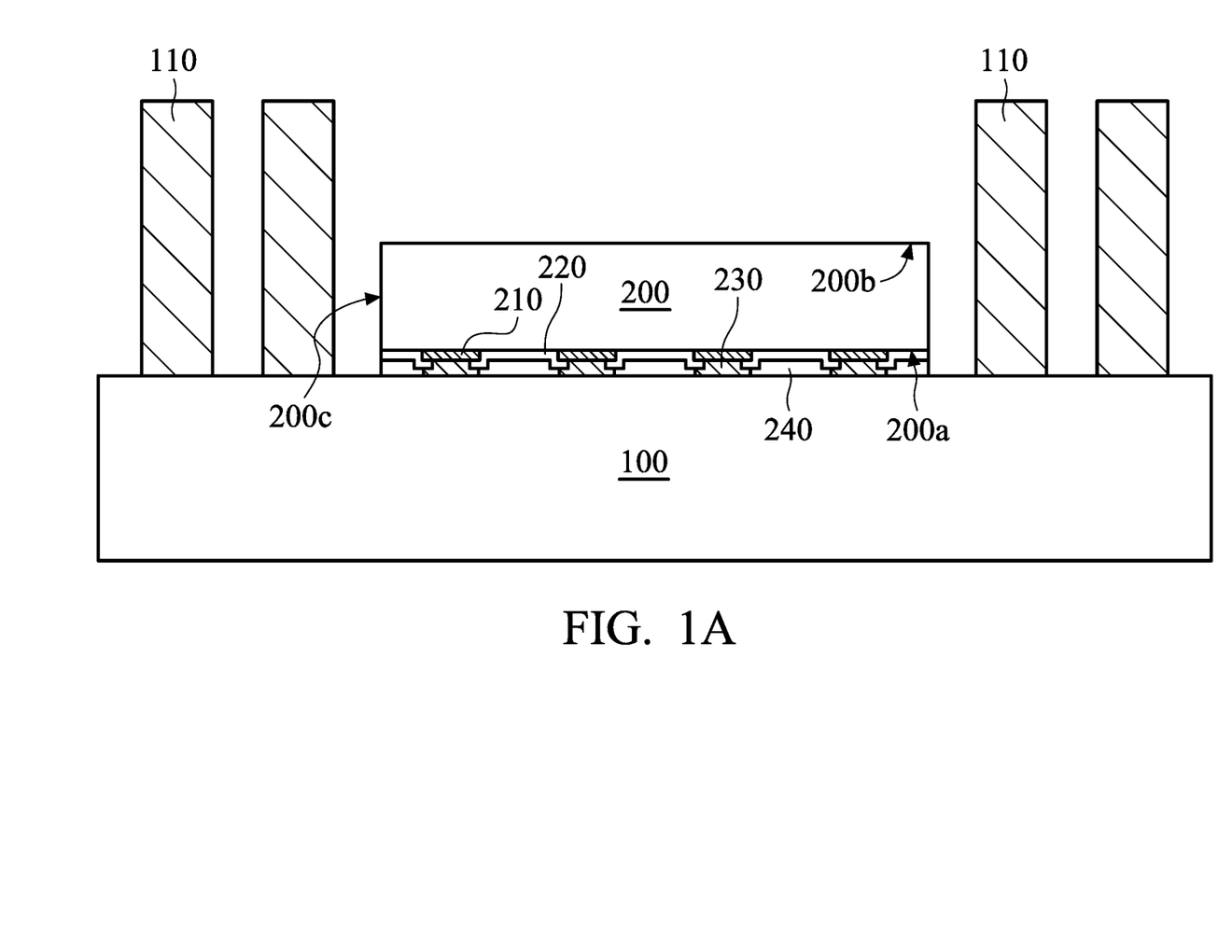
FIGS. 1A-1E are cross-sectional views of various stages of a method for forming a semiconductor package structure, in accordance with some embodiments of the disclosure.

As shown in FIG. 1A, a carrier substrate 100 is provided. The carrier substrate 100 is a temporary substrate and will be removed during subsequent steps. In some embodiments, the carrier substrate 100 is a wafer or a panel. In some embodiments, the carrier substrate 100 includes glass, silicon, or another suitable carrier material.

As shown in FIG. 1A, one or more conductive vias 110 are formed on the carrier substrate 100. The conductive vias 110 are through package vias (TPVs). In some embodiments, the conductive vias 110 include copper or another suitable conductive material.

As shown in FIG. 1A, a semiconductor die 200 is provided on the carrier substrate 100. In some embodiments, the semiconductor die 200 is flipped and attached to the carrier substrate 100 through an adhesive layer (not shown, which will be removed during subsequent steps). In some other embodiments, multiple semiconductor dies 200 are provided on the carrier substrate 100.

In some embodiments, the semiconductor die 200 is a system-on-chip (SOC), a memory die, an analog processor (AP), a digital processor (DP), a baseband (BB) component, a radio-frequency (RF) component, or another suitable active electronic component. The memory die may be a dynamic random access memory (DRAM) die. The logic die may be a central processing unit (CPU), a graphics processing unit (GPU), or a DRAM controller. The semiconductor die 200 includes an active surface 200a, a non-active surface 200b, and a sidewall 200c. The sidewall 200c may be substantially perpendicular to the active surface 200a and the non-active surface 200b.

As shown in FIG. 1A, the semiconductor die 200 includes one or more conductive pads 210 at the active surface 200a. The conductive pads 210 face the carrier substrate 100. The conductive pads 210 may be the topmost layer in an interconnection structure of the semiconductor die 200. In some embodiments, the conductive pads 210 may be included as a conductive trace of the interconnection structure. To simplify the diagram, only the conductive pads 210 are depicted herein. In some embodiments, the conductive pads 210 are formed by an electroplating process, a bonding process or another applicable process.

A passivation layer 220 is disposed at the active surface 200a and partially covers the conductive pads 210. The passivation layer 220 includes one or more openings. Each opening exposes a portion of one of the conductive pads 210.

One or more conductive structures 230 are formed on the passivation layer 220 and fill the openings of the passivation layer 220. As a result, the conductive structures 230 are electrically connected to the conductive pads 210. In some embodiments, the conductive structures 230 are multiple portions of a conductive layer. In some embodiments, the conductive structures 230 are conductive bumps (such as micro bumps), which are balls or pillars. In some other embodiments, the conductive structures 230 are not formed.

An underfill layer 240 is formed on the passivation layer 220 and surrounds an upper portion of the conductive structures 230. In some other embodiments, the underfill layer 240 is not formed.

In some embodiments, the formation of the semiconductor die 200 includes sequentially forming the conductive pads 210, the passivation layer 220, the conductive structures 230 and the underfill layer 240 on a semiconductor wafer or panel. Afterwards, the semiconductor wafer or panel is diced into multiple semiconductor dies. The semiconductor die 200 is known-good and provided on the carrier substrate 100.

In some embodiments, the semiconductor die 200 is provided on the carrier substrate 100 after the formation of the conductive vias 110. In some other embodiments, the semiconductor die 200 is provided on the carrier substrate 100 before the formation of the conductive vias 110. In some embodiments, the conductive vias 110 are thicker than the semiconductor die 200.

Figure 1B:
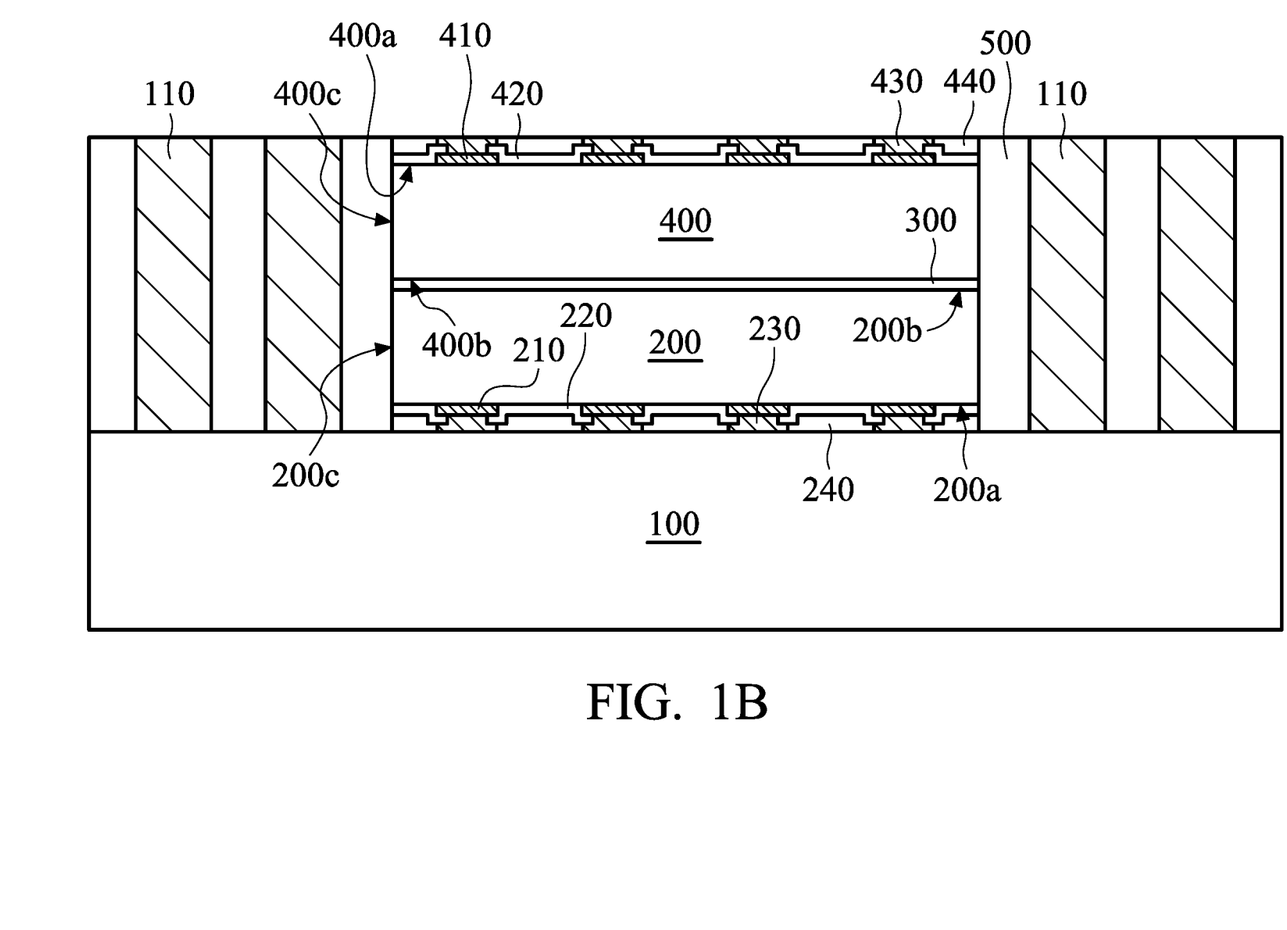

As shown in FIG. 1B, a semiconductor die 400 is vertically stacked on the semiconductor die 200, in accordance with some embodiments of the disclosure. As a result, one of the conductive vias 110 and the semiconductor dies 200 and 400 are positioned side by side. In some embodiments, the conductive vias 110 are thicker than the semiconductor die 400.

In some embodiments, the semiconductor die 400 is attached to the semiconductor die 200 through an adhesive layer 300. The adhesive layer 300 is sandwiched between the semiconductor die 200 and the semiconductor die 400. In some other embodiments, multiple semiconductor dies 400 are stacked on the semiconductor die 200.

In some embodiments, the semiconductor die 400 is a SOC, a memory die, an AP, a DP, a BB component, a RF component, or another suitable active electronic component. The semiconductor die 400 includes an active surface 400a, a non-active surface 400b, and a sidewall 400c. The sidewall 400c may be substantially perpendicular to the active surface 400a and the non-active surface 400b.

In accordance with some embodiments of the disclosure, the non-active surface 400b faces the non-active surface 200b. In some embodiments, the adhesive layer 300 is in direct contact with the non-active surfaces 400b and 200b, and is sandwiched between the non-active surfaces 400b and 200b.

As shown in FIG. 1B, the semiconductor die 400 includes one or more conductive pads 410 at the active surface 400a. The conductive pads 410 face away from the semiconductor die 200 and the carrier substrate 100. As a result, the conductive pads 210 and 410 face away from each other. In some embodiments, the conductive pads 410 are formed by an electroplating process, a bonding process or another applicable process. In some embodiments, the structure and formation of the semiconductor die 400 are similar to or the same as that of the semiconductor die 200. Therefore, the details regarding the passivation layer 420, the conductive structures 430 and the underfill layer 440 are not described again for brevity.

The semiconductor dies 200 and 400 have different functions. For example, in some embodiments, one of the semiconductor dies 200 and 400 is a SOC and the other is a memory die. In some embodiments, one of the semiconductor dies 200 and 400 is an AP and the other is a DP. In some embodiments, one of the semiconductor dies 200 and 400 is a BB component and the other is a RF component. In some other embodiments, the semiconductor dies 200 and 400 may have the same function.

In some embodiments, the semiconductor dies 200 and 400 are the same size, as shown in FIG. 1B. In some other embodiments, the semiconductor dies 200 and 400 are different sizes. The semiconductor dies 200 and 400 may align or misalign to each other. In some embodiments, the semiconductor die 400 completely vertically overlaps the semiconductor die 200. As a result, the sidewall 400c is substantially coplanar with the sidewall 200c. In some other embodiments, the semiconductor die 400 partially vertically overlaps the semiconductor die 200. As a result, the sidewall 400c is non-coplanar with the sidewall 200c.

As shown in FIG. 1B, a molding compound 500 is formed on the carrier substrate 100. The molding compound 500 surrounds the conductive vias 110, the semiconductor dies 200 and 400, and the adhesive layer 300. The molding compound 500 adjoins the sidewalls 200c and 400c.

In some embodiments, a portion of the molding compound 500 is sandwiched between one of the conductive vias 110 and the semiconductor die 200. In some embodiments, a portion of the molding compound 500 is sandwiched between one of the conductive vias 110 and the semiconductor die 400.

In some embodiments, the semiconductor die 400 is narrower than the semiconductor die 200 or the semiconductor dies 200 and 400 do not completely overlap with each other. As a result, a portion of the molding compound 500 extends on the semiconductor die 200. The portion of the molding compound 500 may be in direct contact with the non-active surface 200b. In some embodiments, the semiconductor die 400 is wider than the semiconductor die 200 or the semiconductor dies 200 and 400 do not completely overlap with each other. As a result, a portion of the molding compound 500 extends under the semiconductor die 400. The portion of the molding compound 500 may be in direct contact with the adhesive layer 300.

In some embodiments, the molding compound 500 includes a nonconductive material such as an epoxy, a resin, a moldable polymer, or another suitable molding material. In some embodiments, the molding compound 500 is applied as a substantial liquid, and then is cured through a chemical reaction. In some other embodiments, the molding compound 500 is an ultraviolet (UV) or thermally cured polymer applied as a gel or malleable solid, and then is cured through a UV or thermal curing process. The molding compound 500 may be cured with a mold.

In some embodiments, the deposited molding compound 500 covers the top surfaces of the conductive vias 110 and the conductive structures 430. Afterwards, a thinning process (such as an etching process, a milling process, a grinding process or a polishing process) is performed to thin the deposited molding compound 500. As a result, the thinned molding compound 500 exposes the top surfaces of the conductive vias 110 and the conductive structures 430. In some embodiments, the top surface of the molding compound 500 is substantially coplanar with the top surfaces of the conductive vias 110 and the conductive structures 430.

Figure 1C:
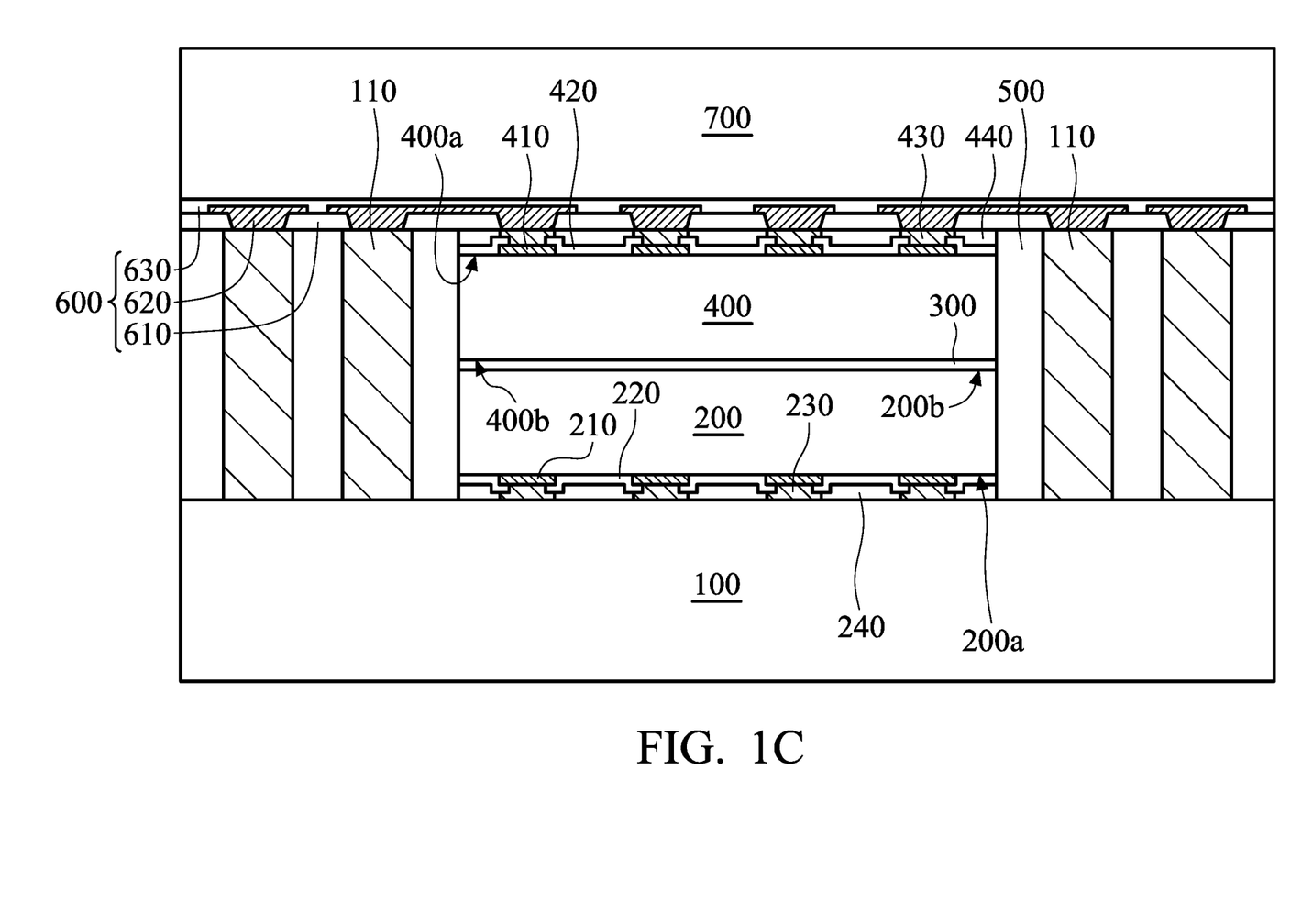

As shown in FIG. 1C, a redistribution layer (RDL) structure 600, which is also referred to as a fan-out structure, is formed on the molding compound 500, the conductive vias 110, and the semiconductor die 400. In some embodiments, the RDL structure 600 may include one or more conductive traces disposed in an IMD layer. The IMD layer may include multiple sub-dielectric layers successively stacked on the molding compound 500.

For example, a plurality of conductive traces 620 is positioned on a first sub-dielectric layer 610 and covered by a second sub-dielectric layer 630. One of the plurality of conductive traces 620 is electrically coupled to the conductive vias 110 and the semiconductor die 400. The conductive pads 410 are electrically connected to the conductive traces 620 of the RDL structure 600 through the conductive structures 430. In some other embodiments, the conductive structures 430 are not formed, and the conductive pads 410 are directly electrically connected to the conductive traces 620. It should be noted that the numbers and the arrangements of the conductive traces and the sub-dielectric layers of the RDL structure 600 shown in the figures are only an example and are not a limitation to the present invention.

In some embodiments, the IMD layer may be formed of organic materials, which include a polymer base material, non-organic materials, which include silicon nitride ($SiN_x$), silicon oxide ($SiO_x$), graphene, or the like. For example, the first and second sub-dielectric layers 610 and 630 are made of a polymer base material, in which the first sub-dielectric layer 610 has a thickness of about 12 µm and the second sub-dielectric layer 630 has a thickness of about 24 µm. In some embodiments, the IMD layer is a high-k dielectric layer (k is the dielectric constant of the dielectric layer). In some other embodiments, the IMD layer may be formed of a photosensitive material, which includes a dry film photoresist, or a taping film.

As shown in FIG. 1C, a supporting substrate 700 is provided on the RDL structure 600. The supporting substrate 700 is a temporary substrate and will be removed during subsequent steps. In some embodiments, the supporting substrate 700 includes glass, silicon, or another suitable supportive material.

Embodiments of the disclosure are not limited. In some other embodiments, the RDL structure 600 is previously formed on the supporting substrate 700. Afterwards, the supporting substrate 700 with the RDL structure 600 is bonded on the molding compound 500, the conductive vias 110, and the semiconductor die 400.

Figure 1D:
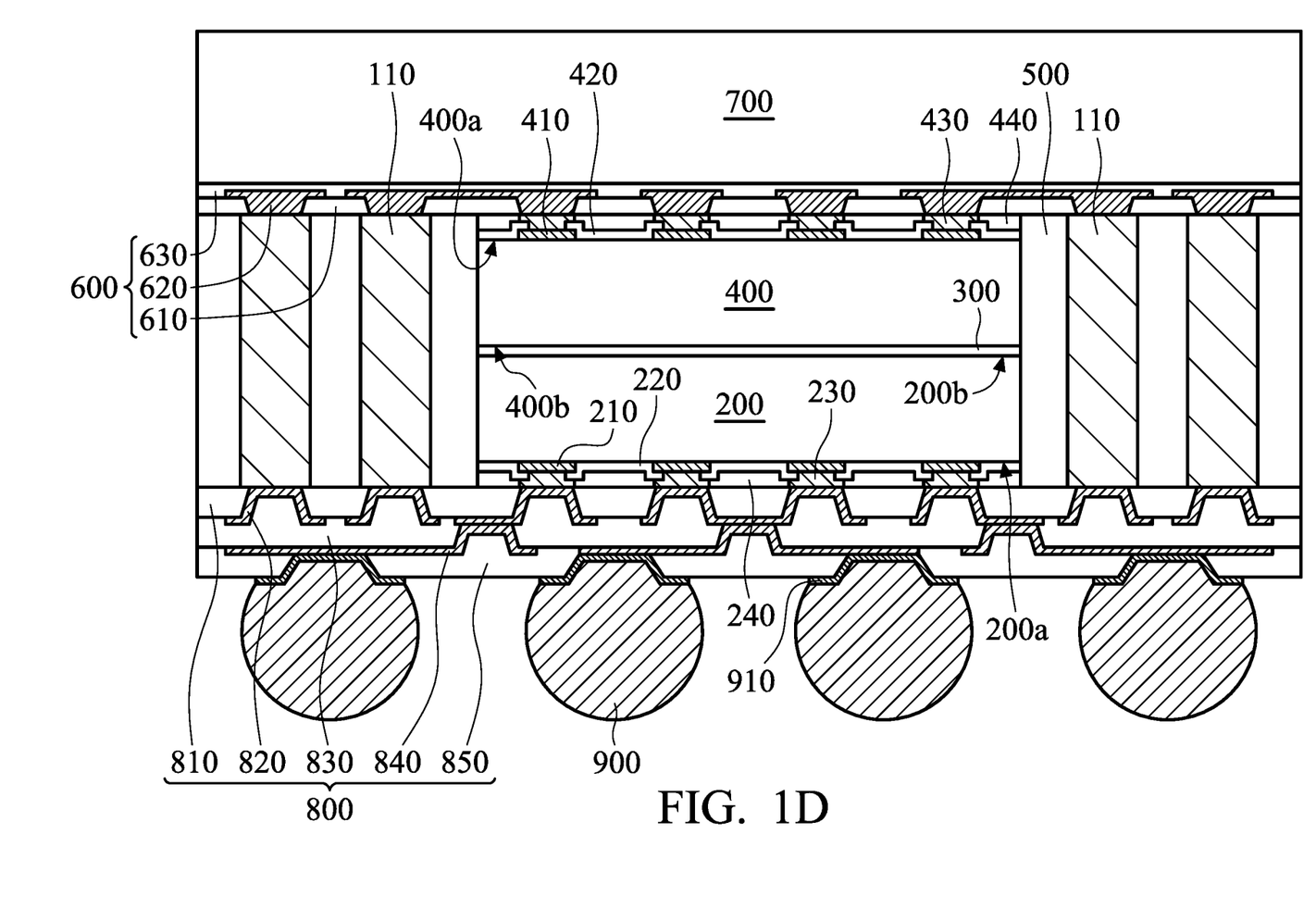

As shown in FIG. 1D, the carrier substrate 100 is removed. In some embodiments, an adhesive layer (not shown) may be sandwiched between the semiconductor die 200 and the carrier substrate 100, as aforementioned. After the removal of the carrier substrate 100, this adhesive layer is also removed. For example, a thinning process (such as a grinding process) is performed to remove the adhesive layer. The conductive vias 110 and the molding compound 500 may be partially removed during the removal of the adhesive layer.

Afterwards, a redistribution layer (RDL) structure 800 is formed using the supporting substrate 700 as a carrier. The RDL structures 600 and 800 are positioned on two opposite sides of the molding compound 500. In other words, the semiconductor die 200 is positioned between the RDL structure 800 and the semiconductor die 400, while the semiconductor die 400 is positioned between the RDL structure 600 and the semiconductor die 200. The RDL structures 600 and 800 are also positioned on two opposite sides of the conductive vias 110 penetrating the molding compound 500. The active surface 200a faces the RDL structure 800 while the active surface 400a faces the RDL structure 600.

In some embodiments, the RDL structure 800 may include one or more conductive traces disposed in an IMD layer. The IMD layer may include multiple sub-dielectric layers successively stacked on the molding compound 500.

For example, a plurality of first conductive traces 820 is positioned on a first sub-dielectric layer 810 and covered by a second sub-dielectric layer 830. One of the plurality of first conductive traces 820 is electrically coupled to the conductive vias 110 and the semiconductor die 200. The conductive pads 210 are electrically connected to the first conductive traces 820 of the RDL structure 600 through the conductive structures 230. In some other embodiments, the conductive structures 230 are not formed, and the conductive pads 210 are directly electrically connected to the first conductive traces 820. A plurality of second conductive traces 840 is positioned on the second sub-dielectric layer 830 and covered by a third sub-dielectric layer 850. It should be noted that the numbers and the arrangements of the conductive traces and the sub-dielectric layers of the RDL structure 800 shown in the figures are only an example and are not a limitation to the present invention.

Pad portions of conductive traces are exposed from the top of the RDL structure 800. For example, the pad portions of the second conductive traces 840 are exposed from openings of the third sub-dielectric layer 850 and connected to subsequently formed conductive components.

Embodiments of the disclosure are not limited. In some other embodiments, the RDL structure 800 is previously formed on the carrier substrate 100. Subsequently, the conductive vias 110, the semiconductor dies 200 and 400, the molding compound 500, and the RDL structure 600 are formed on the RDL structure 800 on the carrier substrate 100. In this case, the semiconductor die 200 is bonded and electrically connected to the RDL structure 800 through the conductive structures 230. After the supporting substrate 700 is provided on the RDL structure 600, the carrier substrate 100 is removed and the RDL structure 800 is exposed.

As shown in FIG. 1D, one or more conductive components 900 are formed on the RDL structure 800 using the supporting substrate 700 as a carrier. The conductive components 900 are electrically connected to the pad portions of the second conductive traces 840. In some embodiments, the conductive components 900 are conductive pillars, conductive bumps (such as micro bumps), conductive paste structures, or another suitable conductive component. The conductive components 900 may include copper, solder, or another suitable conductive material.

In some embodiments, there is an under-bump metallurgy (UBM) layer 910 between one of the conductive components 900 and one pad portion of the second conductive traces 840. The UBM layer 910 may include one or more layers, such as a barrier layer and a seed layer. The UBM layer 910 including a single layer is depicted herein as an example.

Figure 1E:
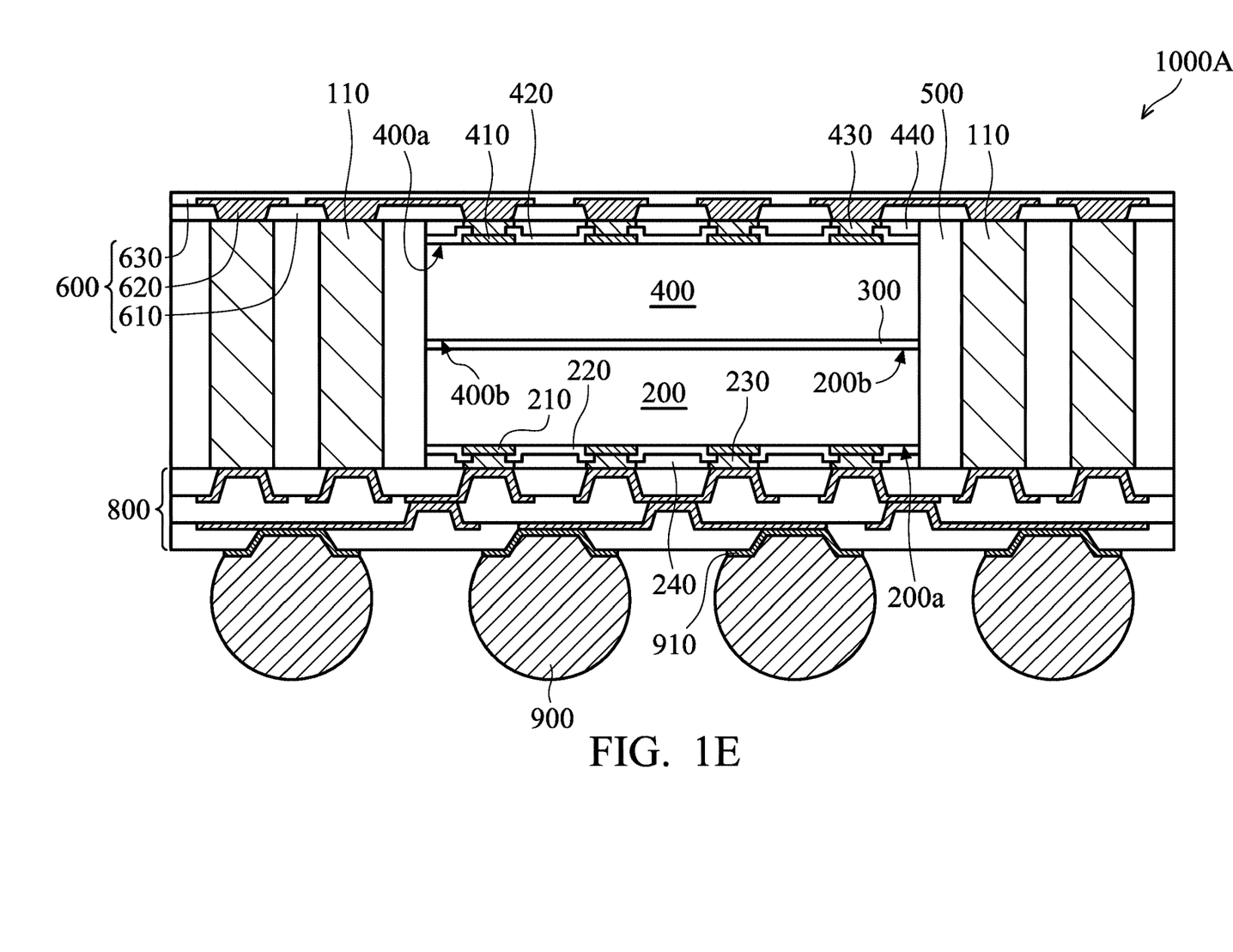

As shown in FIG. 1E, the supporting substrate 700 is removed. As a result, the RDL structure 600 is exposed. In some embodiments, a singulation process is performed after the removal of the supporting substrate 700. For example, the RDL structures 600 and 800, and the molding compound 500 may be cut. As a result, multiple semiconductor packages 1000A are formed. In some embodiments, the semiconductor package 1000A can be directly bonded onto a printed circuit board (PCB). In this case, there is no semiconductor device (such as a semiconductor die or a semiconductor package) stacked on the semiconductor package 1000A.

As shown in FIG. 1E, each of the semiconductor packages 1000A includes vertically stacked semiconductor dies 200 and 400. In particular, the non-active surface 200b of the semiconductor die 200 faces the non-active surface 400b of the semiconductor die 400. The semiconductor dies 200 and 400 are electrically connected to each other through the overlying RDL structure 600, the underlying RDL structure 800, and the conductive vias 110 by the side thereof. As a result, multiple semiconductor dies can be integrated in a semiconductor package without increasing the horizontal size (area) of the semiconductor package. Moreover, the length of electrical conduction paths from semiconductor dies to a PCB is short, and there are a large number of the electrical conduction paths. Therefore, a multi-die semiconductor package with a smaller size and better electrical performance is provided.

Figure 2:
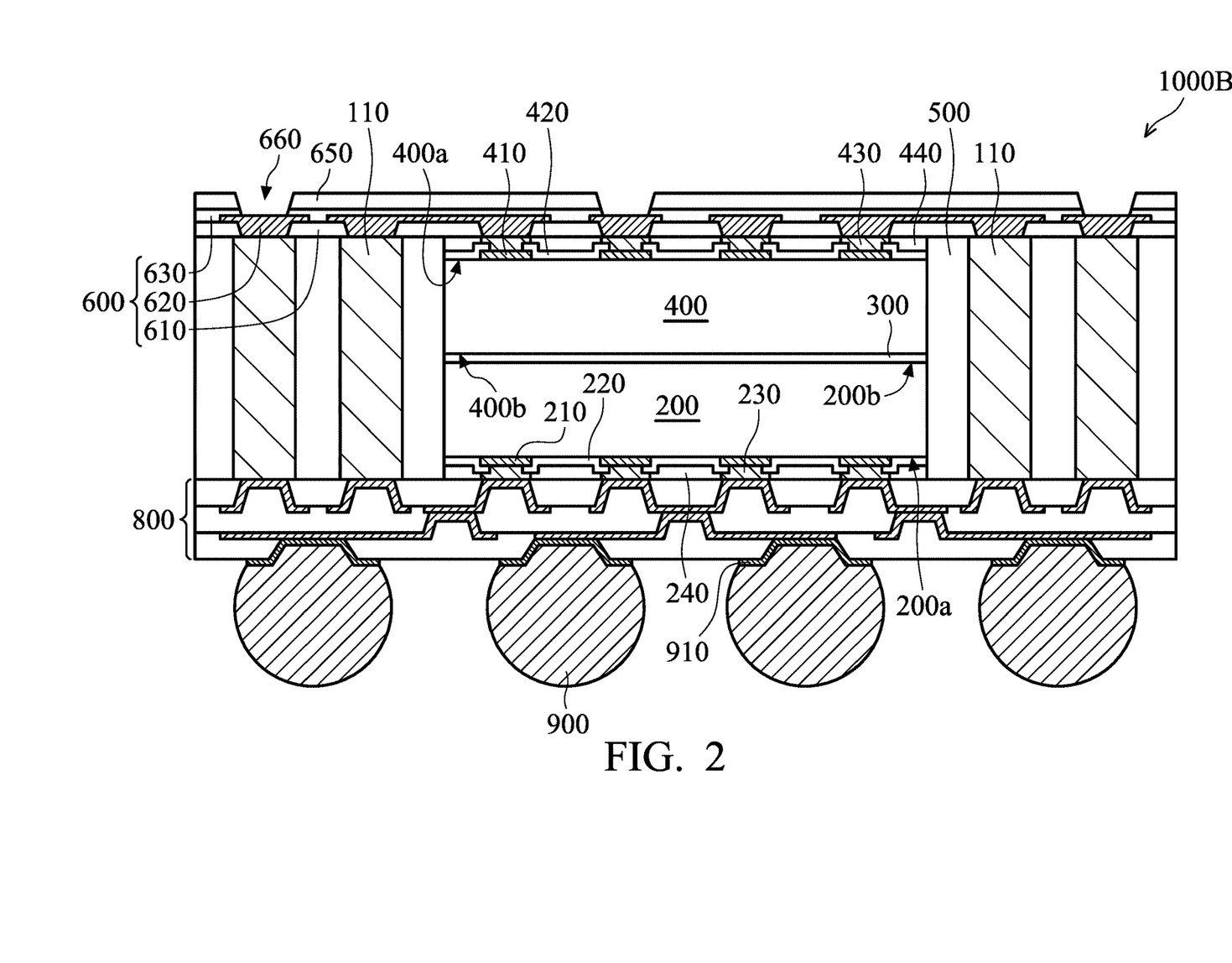
FIG. 2 is a cross-sectional view of a semiconductor package structure, in accordance with some embodiments of the disclosure.

Many variations and/or modifications can be made to embodiments of the disclosure. FIG. 2 is a cross-sectional view of a semiconductor package structure, in accordance with some embodiments of the disclosure. Elements in FIG. 2 that are the same as those in FIGS. 1A-1E are labeled with the same reference numbers as in FIGS. 1A-1E and are not described again for brevity.

The structure of the semiconductor package 1000B shown in FIG. 2 is similar to that of the semiconductor package 1000A shown in FIG. 1E. The difference between them is that there is a solder mask layer 650 on the RDL structure 600 of the semiconductor package 1000B. One or more openings 660 are formed in the solder mask layer 650 and extend into the RDL structure 600 so as to expose pad portions of conductive traces in the RDL structure 600. For example, the openings 660 extend into the second sub-dielectric layer 630. As a result, the pad portions of the conductive traces 620 are exposed from the openings 660.

The purpose of the formation of the solder mask layer 650 and the openings 660 is further electrical connection. For example, a chip/die may be bonded on the solder mask layer 650 and is electrically connected to the RDL structure 600 through the openings 660. Alternatively, a package may be stacked on the semiconductor package 1000B and is electrically connected to the RDL structure 600 through the openings 660. For example, the package may be a memory package (such as a DRAM package) or another suitable package. As a result, a semiconductor package assembly including multiple semiconductor packages can be formed. An example of the semiconductor package assembly will be described in more detail later.

Figure 3:
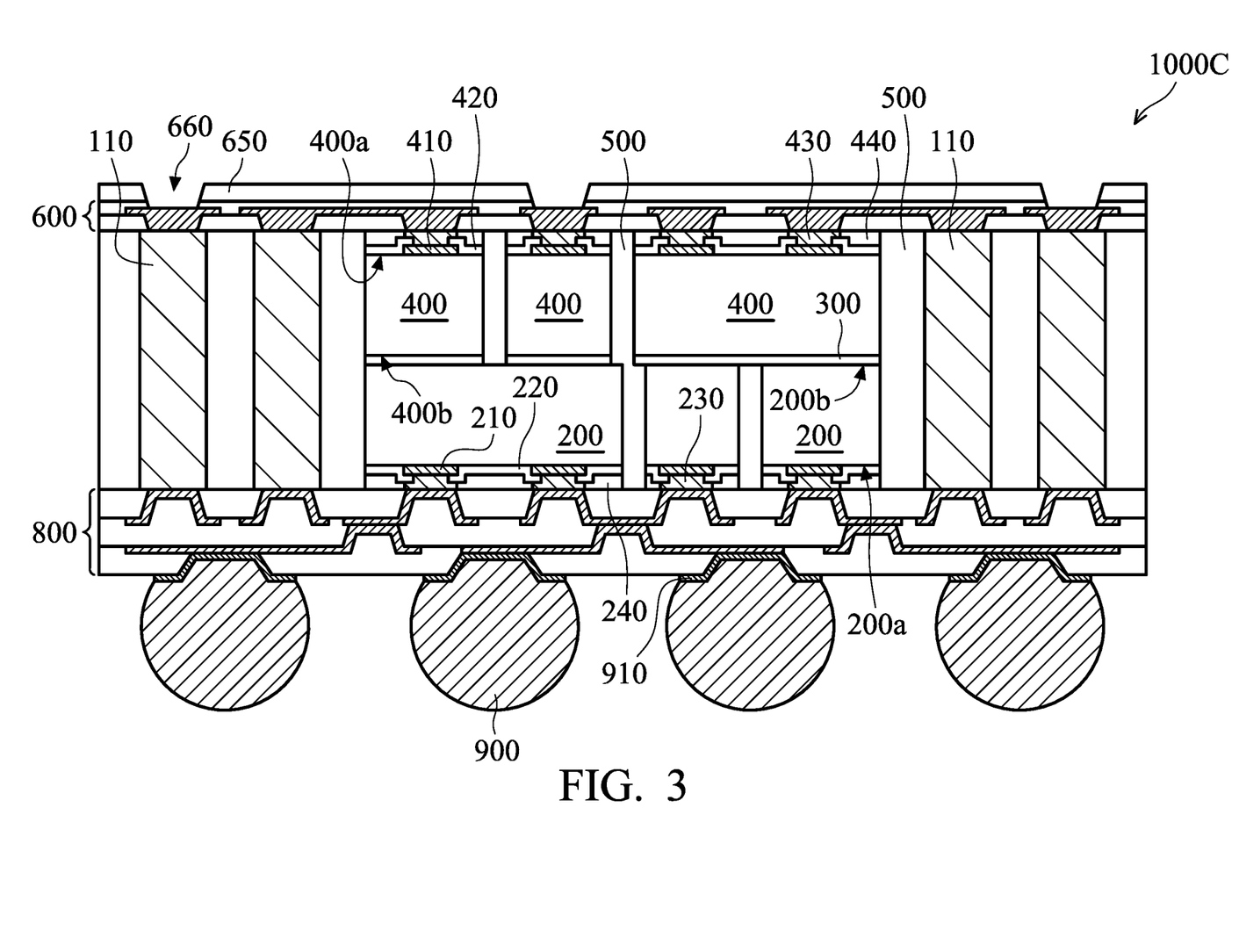
FIG. 3 is a cross-sectional view of a semiconductor package structure, in accordance with some embodiments of the disclosure.
Figure 4:
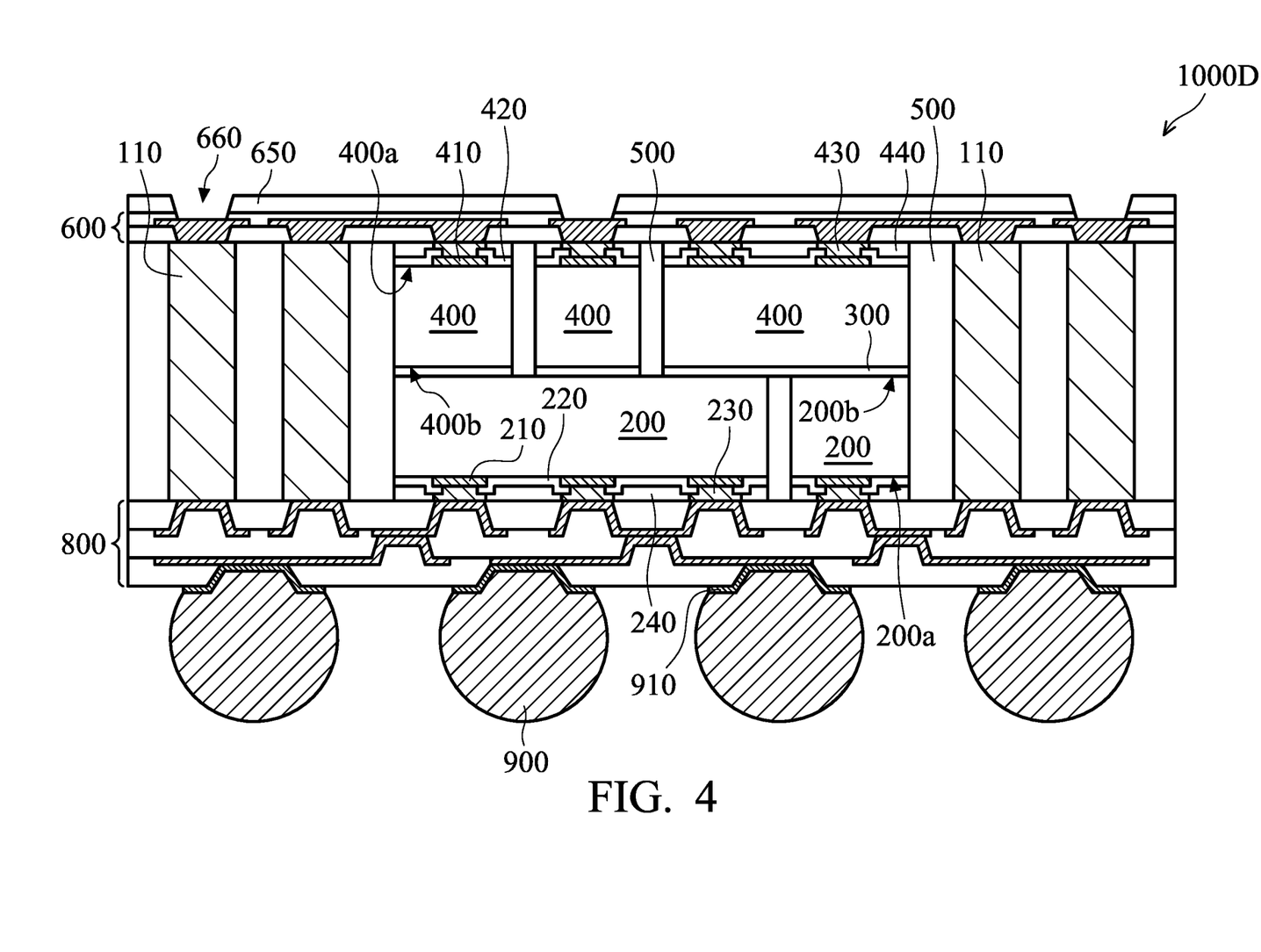
FIG. 4 is a cross-sectional view of a semiconductor package structure, in accordance with some embodiments of the disclosure.

Embodiments of the disclosure are not limited to the aforementioned embodiments. More than two semiconductor dies can be integrated in a semiconductor package. FIGS. 3 and 4 are cross-sectional views of a semiconductor package structure, in accordance with some embodiments of the disclosure. Elements in FIGS. 3 and 4 that are the same as those in FIGS. 1A-1E and 2 are labeled with the same reference numbers as in FIGS. 1A-1E and 2 and are not described again for brevity.

The structure of the semiconductor package 1000C shown in FIG. 3 is similar to that of the semiconductor package 1000B shown in FIG. 2. The difference between them is that there are multiple semiconductor dies 200 and multiple semiconductor dies 400 in the semiconductor package 1000C.

As shown in FIG. 3, in some embodiments, multiple semiconductor dies 400 are vertically stacked on one semiconductor die 200. In some embodiments, one semiconductor die 400 is vertically stacked on multiple semiconductor dies 200. In some embodiments, one of multiple semiconductor dies 400 and one of multiple semiconductor dies 200 do not vertically overlap with each other. In some embodiments, the semiconductor dies 200 are different sizes. In some other embodiments, the semiconductor dies 200 are the same size. In some embodiments, the semiconductor dies 400 are different sizes. In some other embodiments, the semiconductor dies 400 are the same size. In some embodiments, some portions of the molding compound 500 extend between the semiconductor dies 200 and between the semiconductor dies 400, as shown in FIG. 3.

The structure of the semiconductor package 1000D shown in FIG. 4 is similar to that of the semiconductor packages 1000B and 1000C. The difference between them is that there are multiple semiconductor dies 200 vertically stacked on multiple semiconductor dies 400 in the semiconductor package 1000D. The semiconductor dies 200 may be different sizes or the same size. The semiconductor dies 400 may be different sizes or the same size. As shown in FIG. 4, in some embodiments, some portions of the molding compound 500 extend between the semiconductor dies 200 and between the semiconductor dies 400.

Although the semiconductor package 1000B, 1000C, or 1000D includes a solder mask layer 650 with openings 660 on the RDL structure 600, embodiments of the disclosure are not limited thereto. In some embodiments, the openings 660, which partially expose the RDL structure 600, are not formed. In some embodiments, the solder mask layer 650 is not formed on the RDL structure 600. In these cases, there is no semiconductor device (such as a semiconductor die or a semiconductor package) stacked on the semiconductor package 1000B, 1000C, or 1000D.

The semiconductor package structure and methods for forming the same in accordance with some embodiments of the disclosure provide various advantages. Multiple vertically stacked semiconductor dies are integrated in a semiconductor package 1000A, 1000B, 1000C, or 1000D. Compared to a dual dies fan-out package including two dies disposed side by side, the horizontal size (area) of the semiconductor package 1000A, 1000B, 1000C, or 1000D is much small. Warpage issue can be prevented, too. Compared to a 3D PoP structure including vertically stacked packages, the vertical size (thickness) of the semiconductor package 1000A, 1000B, 1000C, or 1000D is much small. Accordingly, the size of a semiconductor package including multiple semiconductor dies is significantly reduced. In addition, compared to TSV technology, the formation of the semiconductor package 1000A, 1000B, 1000C, or 1000D is simple and the necessary fabrication cost and time are much less.

Figure 5:
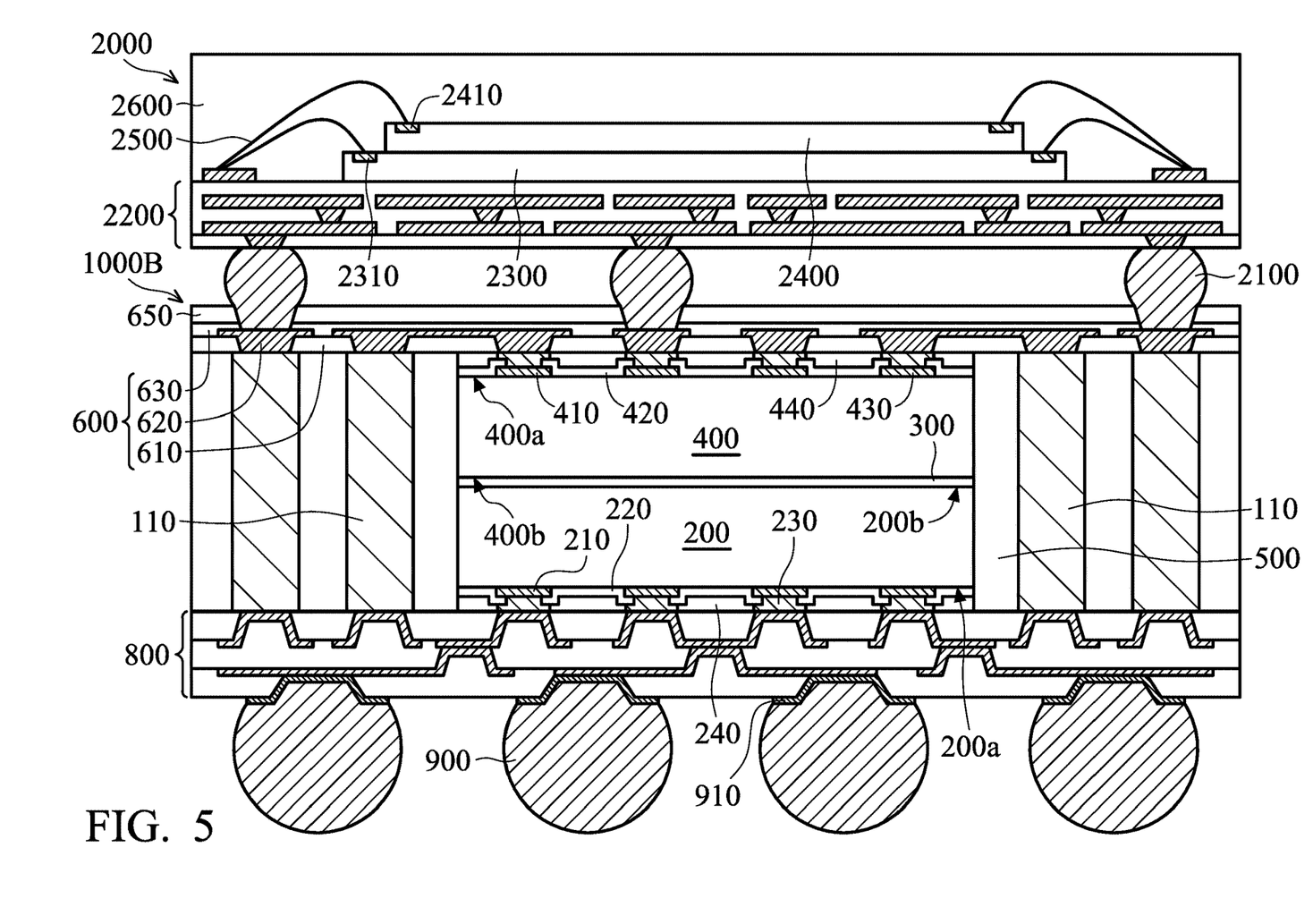
FIG. 5 is a cross-sectional view of a semiconductor package structure, in accordance with some embodiments of the disclosure.

As mentioned above, various semiconductor packages can be further stacked on the semiconductor package 1000B, 1000C, or 1000D. For example, a semiconductor package 2000 is vertically stacked on the semiconductor package 1000B, as shown in FIG. 5. FIG. 5 is a cross-sectional view of a semiconductor package structure, in accordance with some embodiments of the disclosure. Elements in FIG. 5 that are the same as those in FIGS. 1A-1E and 2 are labeled with the same reference numbers as in FIGS. 1A-1E and 2 and are not described again for brevity. It should be noted that the structure of the semiconductor package 2000 shown in FIG. 5 is only an example and is not a limitation to the present invention.

The semiconductor package 2000 and the semiconductor package 1000B are mounted together and are electrically connected to each other through conductive components 2100. The conductive components 2100 are located in the openings 660 and protrude from the solder mask layer 650. In some embodiments, the conductive components 2100 are conductive bumps (such as micro bumps), conductive pillars, conductive paste structures, or another suitable conductive component. The conductive components 2100 may include copper, solder, or another suitable conductive material. In some other embodiments, the conductive components 2100 are surrounded by an underfill material.

In some embodiments, the semiconductor package 2000 comprises a base 2200, at least one semiconductor die (such as two vertically stacked semiconductor dies 2300 and 2400), bonding wires 2500 and a molding compound 2600. In some embodiments, the base 2200 is a PCB and may be formed of PP or another suitable material. The base 2200 is electrically connected to the RDL structure 600 through the conductive components 2100.

The semiconductor die 2300 is attached on the base 2200 through an adhesive layer such as glue or another suitable adhesive material. The semiconductor die 2300 is electrically connected to the base 2200 through its pads 2310 and the bonding wires 2500. In some embodiments, the semiconductor die 2300 is a memory die or another suitable semiconductor die. The semiconductor die 2400 is attached on the semiconductor die 2300 through an adhesive layer such as glue or another suitable adhesive material. The semiconductor die 2400 is electrically connected to the base 2200 through its pads 2410 and the bonding wires 2500. In some embodiments, the semiconductor die 2400 is a memory die or another suitable semiconductor die. In some embodiments, the semiconductor dies 2300 and 2400 are DRAM dies. In some embodiments, the pads 2310 and/or 2410 are formed by an electroplating process, a bonding process or another applicable process.

The molding compound 2600 covers the base 2200 and surrounds the semiconductor dies 2300 and 2400. The bonding wires 2500 are embedded in the molding compound 2600. In some embodiments, the molding compound 2600 is formed of a nonconductive material such as an epoxy, a resin, a moldable polymer, or another suitable molding material.

As shown in FIG. 5, the small-sized semiconductor package 1000A and the semiconductor package 2000 are vertically stacked and integrated in the semiconductor package structure/assembly. As a result, a PoP structure including more than two semiconductor dies is provided and its size is greatly reduced.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a first semiconductor die comprising a first active surface and a first non-active surface;
   a second semiconductor die comprising a second active surface and a second non-active surface, wherein the second semiconductor die is stacked on the first semiconductor die, and the first non-active surface faces the second non-active surface;
   a third semiconductor die comprising a third active surface and a third non-active surface, wherein the third semiconductor die is stacked on the first semiconductor die, and the first non-active surface faces the third non-active surface;
   a first redistribution layer structure, wherein the first active surface faces the first redistribution layer structure;
   a second redistribution layer structure, wherein the second active surface faces the second redistribution layer structure;
   conductive vias extending between the first and second redistribution layer structures electrically connecting the first and second semiconductor dies through the first and second redistribution layer structures; and
   a semiconductor package disposed over the second redistribution layer structure, the semiconductor package being electrically and physically in contact with the second redistribution layer structure, wherein each of the first redistribution layer structure and the second redistribution layer structure comprises a conductive trace disposed in an IMD layer, and wherein the semiconductor package structure further comprises a molding compound between the second and third semiconductor dies, and wherein the semiconductor package structure further comprises a fourth semiconductor die comprising a fourth active surface and a fourth non-active surface, wherein the third semiconductor die is stacked on the fourth semiconductor die, and the fourth non-active surface faces the third non-active surface.

2. The semiconductor package structure as claimed in claim 1, further comprising an adhesive layer in direct contact with the first non-active surface and the second non-active surface.

3. The semiconductor package structure as claimed in claim 1, wherein the conductive vias are disposed around the first and second semiconductor dies.

4. The semiconductor package structure as claimed in claim 3, further comprising a portion of the molding compound surrounding the conductive vias and the first and second semiconductor dies.

5. The semiconductor package structure as claimed in claim 4, wherein the first redistribution layer structure and the second redistribution layer structure are located on two opposite sides of the portion of the molding compound.

6. The semiconductor package structure as claimed in claim 1, wherein a sidewall of the first semiconductor die is substantially coplanar with a sidewall of the second semiconductor die.

7. A semiconductor package structure, comprising:
a first semiconductor die comprising a first conductive pad, the first semiconductor die comprising a first active surface and a first non-active surface;
a second semiconductor die comprising a second conductive pad, wherein the second semiconductor die vertically overlaps the first semiconductor die, and the first and second conductive pads face away from each other, the second semiconductor die comprising a second active surface and a second non-active surface;
a third semiconductor die stacked on the first semiconductor die, the third semiconductor die having a third non-active surface and a third active surface;
at least one molding compound surrounding the first semiconductor die and the second semiconductor die, and between the second and third semiconductor dies;
a first redistribution layer structure and a second redistribution layer structure positioned on two opposite sides of the at least one molding compound, wherein each of the first redistribution layer structure and the second redistribution layer structure comprises a conductive trace disposed in an IMD layer;
conductive vias extending between the first and second redistribution layer structures electrically connecting the first and second semiconductor dies through the first and second redistribution layer structures; and
a semiconductor package disposed over the second redistribution layer structure, the semiconductor package being electrically and physically in contact with the second redistribution layer structure,
wherein the semiconductor package structure further comprises a fourth semiconductor die comprising a fourth active surface and a fourth non-active surface, wherein the third semiconductor die is stacked on the fourth semiconductor die, and the fourth non-active surface faces the third non-active surface.

8. The semiconductor package structure as claimed in claim 7, wherein the conductive vias penetrate the at least one molding compound, and wherein the first conductive pad is electrically connected to the second conductive pad through at least one conductive via.

9. The semiconductor package structure as claimed in claim 8, wherein a portion of the at least one molding compound is sandwiched between the conductive vias and the first or second semiconductor die.

10. The semiconductor package structure as claimed in claim 8, wherein the conductive vias are thicker than one or both of the first semiconductor die and the second semiconductor die.

11. The semiconductor package structure as claimed in claim 7, further comprising an adhesive layer between the first semiconductor die and the second semiconductor die and surrounded by the at least one molding compound.

12. The semiconductor package structure as claimed in claim 7,
wherein the first conductive pad faces the first redistribution layer structure and the second conductive pad faces the second redistribution layer structure.

13. The semiconductor package structure as claimed in claim 12, further comprising a conductive component connected to the first redistribution layer structure.

14. The semiconductor package structure as claimed in claim 13, further comprising a solder mask layer on the second redistribution layer structure, wherein the solder mask layer comprises an opening exposing a portion of the second redistribution layer structure.

15. A method for forming a semiconductor package structure, comprising:
providing a first semiconductor die comprising a first active surface and a first non-active surface;
stacking a second semiconductor die and a third semiconductor die on the first semiconductor die, wherein the first non-active surface faces a second non-active surface of the second semiconductor die and a third non-active surface of the third semiconductor die, wherein the third semiconductor die is stacked on a fourth semiconductor die comprising a fourth active surface and a fourth non-active surface, and the fourth non-active surface faces the third non-active surface;
forming conductive vias;
forming at least one molding compound surrounding the first and second semiconductor dies, and between the second and third semiconductor dies, wherein the at least one molding compound is thicker than a vertical stack of the first semiconductor die and the second semiconductor die and the conductive vias extend completely through the at least one molding compound;
forming a first redistribution layer structure, wherein the first active surface faces the first redistribution layer structure; and
forming a second redistribution layer structure, wherein a second active area of the second semiconductor die faces the second redistribution layer structure, and the first and second redistribution layer structures are positioned on two opposite sides of the at least one molding compound,
wherein the conductive vias electrically connect the first and second semiconductor dies through the first and second redistribution layer structures.

16. The method as claimed in claim 15, wherein the conductive vias are disposed around the first and second semiconductor dies.

17. The method as claimed in claim 16, wherein the first semiconductor die is provided on a carrier substrate and the conductive vias are formed on the carrier substrate, and the method further comprises removing the carrier substrate after the formation of the second redistribution layer structure.

18. The method as claimed in claim 17, further comprising:
provinding a supporting substrate on the second redistribution layer structure before the removal of the carrier substrate; and
removing the supporting substrate after the formation of the first redistribution layer structure.

19. The method as claimed in claim 15, wherein the second non-active surface is attached to the first non-active surface through an adhesive layer.

* * * * *